United States Patent
Dennison et al.

(10) Patent No.: US 6,818,496 B2
(45) Date of Patent: Nov. 16, 2004

(54) SILICON ON INSULATOR DRAM PROCESS UTILIZING BOTH FULLY AND PARTIALLY DEPLETED DEVICES

(75) Inventors: Charles H. Dennison, San Jose, CA (US); John K. Zahurak, Boise, ID (US)

(73) Assignee: Micron Technology, Inc,, Boise, ID (US)

( * ) Notice: Subject to any disclaimer, the term of this patent is extended or adjusted under 35 U.S.C. 154(b) by 0 days.

(21) Appl. No.: 10/265,426

(22) Filed: Oct. 7, 2002

(65) Prior Publication Data

US 2003/0032262 A1 Feb. 13, 2003

Related U.S. Application Data

(62) Division of application No. 09/650,081, filed on Aug. 29, 2000, now Pat. No. 6,537,891.

(51) Int. Cl.[7] .......................................... H01L 21/8242
(52) U.S. Cl. ...................... 438/239; 438/149; 438/244; 438/250; 438/253; 438/311; 438/517; 257/62; 257/71; 257/638
(58) Field of Search ................................ 438/149, 311, 438/516–517, 406, 239–256, 381–387; 251/62, 68–71, 638, 296, 348

(56) References Cited

U.S. PATENT DOCUMENTS

| | | | |
|---|---|---|---|
| 3,894,891 A | 7/1975 | Magdo et al. | |
| 4,153,904 A | 5/1979 | Tasch, Jr. et al. | |
| 4,313,971 A | 2/1982 | Wheatley, Jr. | |
| 5,488,579 A | 1/1996 | Sharma | 365/185 |
| 5,594,371 A | 1/1997 | Douseki | 326/119 |
| 5,670,387 A | 9/1997 | Sun | 437/21 |
| 5,670,388 A | 9/1997 | Machesney et al. | 437/21 |
| 5,767,549 A | 6/1998 | Chen | 247/347 |

(List continued on next page.)

FOREIGN PATENT DOCUMENTS

JP 06-268215 * 9/1994 ......... H01L/29/784

OTHER PUBLICATIONS

US 5,896,309, 4/1999, Prall (withdrawn)

Yoshino et al. "Comparison of fully depleted and partially depleted mode transistors for practical high–speed, low–power 0.35 um cmos/simox circuits." proceedings 1994 IEEE international soi conference, Oct. 1994 94ch35722, p. 107–108.*

Huang et al. "TFSOI complementary bicoms technolgy for low power application" IEEE transactions of electron devices, vol. 42 No. 3 Mar. 1995 p. 506–512.*

Persun et al. "Design of si and SiGe p–channel soi mosfet" solid–state electronics vol. 41 No. 5 pp 761–769.*

Anthony Cataldo; IBM Preps SOI–based PowerPCs ; Jun. 22, 1999; http://www/eetimes.com/story OEG19990615S-0037.

Takakuni Douseki et al; A 0.5–V MTCMOS/SIMOX Logic Gate; IEEE J. Solid–State Cir vol. 32. No. 10, Oct. 1977.

*Primary Examiner*—Matthew Smith
*Assistant Examiner*—Granvill D. Lee, Jr.
(74) *Attorney, Agent, or Firm*—Shapiro Morin & Oshinsky LLP (57) ABSTRACT

This invention relates to the field of semiconductor integrated circuits and, particularly to stand-alone and embedded memory chips fabricated on Silicon-on-Insulator (SOI) substrates and devices. Partially depleted (PD) and fully depleted (FD) devices are utilized on the same chip. The invention is a process flow utilizing fully depleted SOI devices in one area of the chip and partially depleted SOI devices in selected other areas of the chip. The choice of fully depleted or partially depleted is solely determined by the circuit application in that specific area of the chip. The invention is able to be utilized in accordance with DRAM processing, and especially embedded DRAMs with their large proportion of associated logic circuitry.

19 Claims, 7 Drawing Sheets

U.S. PATENT DOCUMENTS

| | | |
|---|---|---|
| 5,789,286 A | 8/1998 | Subbanna .................... 438/221 |
| 5,811,855 A | 9/1998 | Tyson et al. ................. 257/349 |
| 5,821,769 A | 10/1998 | Douseki ....................... 326/34 |
| 5,877,046 A | 3/1999 | Yu et al. ...................... 438/151 |
| 5,929,476 A | 7/1999 | Prall .......................... 257/296 |
| 5,940,691 A | 8/1999 | Manning .................... 438/151 |
| 5,985,683 A | 11/1999 | Jewell |
| 5,985,728 A | 11/1999 | Jennings |
| 6,054,345 A | 4/2000 | Alsmeier et al. ........... 438/238 |
| 6,061,268 A | 5/2000 | Kuo et al. ................... 365/156 |
| 6,084,259 A | 7/2000 | Kwon et al. |
| 6,144,072 A | 11/2000 | Iwamatsu et al. |
| 6,326,247 B1 * | 12/2001 | Krishnan et al. ........... 438/151 |
| 6,424,016 B1 * | 7/2002 | Houston ...................... 257/407 |
| 6,448,114 B1 * | 9/2002 | An et al. ..................... 438/142 |
| 6,492,209 B1 * | 12/2002 | Krishnan et al. ........... 438/149 |
| 6,521,948 B2 * | 2/2003 | Ebina ......................... 257/347 |
| 6,528,377 B1 * | 3/2003 | Mihopoulos et al. ....... 438/311 |
| 6,537,891 B1 * | 3/2003 | Dennison et al. ........... 438/406 |
| 2004/0036126 A1 * | 2/2004 | Chau et al. ................. 257/401 |

* cited by examiner

SILICON ON INSULATOR DRAM PROCESS UTILIZING BOTH FULLY AND PARTIALLY DEPLETED DEVICES

This application is a divisional of U.S. patent application Ser. No. 09/650,081, filed Aug. 29, 2000 now U.S. Pat. No. 6,537,891 entitled SILICON ON INSULATOR DRAM PROCESS UTILIZING BOTH FULLY AND PARTIALLY DEPLETED DEVICES, the entirety of which is hereby incorporated by reference herein.

FIELD OF THE INVENTION

This invention relates to the field of semiconductor integrated circuits and, particularly to stand-alone and embedded memory chips fabricated using Silicon-on-Insulator (SOI) substrates having partially depleted (PD) and fully depleted (FD) devices fabricated on the same chip.

BACKGROUND OF THE INVENTION

Silicon-on-Insulator (SOI) technology employs a layer of semiconductor material formed over an insulating layer on a supporting bulk wafer. The structure can be formed by different well-known techniques in the art, for example, separation by implanted oxygen (SIMOX), bonding and etching back (BESOI), and zone melting and re-crystallization (ZMR), among others. Typically, the structure comprises a film of monocrystalline silicon formed over a buried layer of silicon oxide, which is formed over a monocrystalline silicon substrate.

SOI substrates are being used to manufacture everything from microprocessors to SRAMs. SOI substrates offer increased drive current, lower parasitic capacitance, improved sub-threshold behavior, and improved packing density for integrated circuit processing. These qualities of SOI technology combine to provide distinct speed advantages for devices utilizing such substrates.

DRAM memory circuits are currently the most popular type of memory circuits used as the main memory of processor-based systems. Efforts have been made to apply SOI technology to DRAM chips. However, because of the floating body effects present in partially depleted SOI devices, widespread application has been impractical due to the negative impact on access device performance caused by these effects.

Floating body effects are caused by a build up of charge in the silicon region under the channel depletion region. This charge build up alters the I/V curve causing "kinks" or sharp irregularities in the current-voltage curve, lowers threshold voltage ($V_t$), and causes transistor performance to have a history dependence. The body effect can cause serious degradation to SOI transistor performance in certain applications. Due to this degradation, DRAM circuits have largely been limited to being fabricated on fully depleted SOI substrates where the depletion region under the gate extends to the insulating buried oxide (BOX). Despite the discussed drawbacks, in some circumstances the floating body of partially depleted SOI devices may provide certain advantages over fully depleted devices. For example, a partially depleted device may provide higher drive current through the channel region, which will allow for faster operation of the integrated circuit. This characteristic of partially depleted devices is useful in the periphery devices of a DRAM chip because of their need for increased operation speed and drive current.

There is a need for a simplified method of forming a memory circuit on a SOI substrate where the transistor devices may be formed over both partially depleted and fully depleted regions so that the advantages of each transistor type, and the advantages of the SOI substrate, may be utilized in combination in a single memory chip. A memory circuit formed by such a method would achieve increased drive current by incorporating the partially depleted devices as discussed above, thereby allowing the IC to run faster and more efficiently. It would also achieve the advantages of the improved device behavior and refresh characteristics available to fully depleted SOI devices. It would be optimal if such a method for forming both fully depleted and partially depleted devices on a single SOI substrate could utilize the currently available techniques for fabricating a semiconductor device and limit the necessary steps for forming such a device to as few as possible, thereby saving time and costs.

SUMMARY OF THE INVENTION

This invention provides a simple method for forming both partially depleted (PD) and fully depleted (FD) devices on a single memory chip. By utilizing the process of this invention, memory chips may be obtained that utilize both the device behavior advantages of fully depleted devices and the drive and speed advantages of partially depleted devices. Additionally, by utilizing the process of this invention, Silicon-on-Insulator (SOI) substrates may be used so as to obtain the performance advantages of such a dual-depletion region substrate.

Additionally, this invention utilizes common process steps used in current DRAM manufacturing. The dual-depletion regions may be formed simultaneously, thereby reducing the number of steps and required time of processing. Additionally, multiple steps may be performed using a single mask, resulting in a self-aligned process. The process of this invention results in a simple dual-depletion region SOI structure that is less expensive to manufacture.

The above-described and other advantages and features of the invention will be more clearly understood from the following detailed description of an exemplary embodiment, which is provided in connection with the accompanying drawings.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that various structural, logical, and electrical changes may be made without departing from the spirit or scope of the invention.

Also, the terms "wafer" and "substrate" are used interchangeably and are to be understood as including Silicon-on-Insulator (SOI) technology, with doped and undoped semiconductors. Furthermore, references to a "wafer" or "substrate" in the following description, do not exclude previous processing steps utilized to form regions or junctions in, on, or over the base semiconductor structure or foundation.

No particular order is required for the method steps described below, with the exception of those logically requiring the results of prior steps. Accordingly, while many of the steps discussed below are discussed as being performed in an exemplary order, this order may be altered.

SOI technology offers many advantages, including those associated with providing full isolation for overlying devices. SOI may offer simpler fabrication processes and sequences compared to circuits fabricated on bulk silicon. SOI provides reduced capacitive coupling between various circuit elements over the entire integrated circuit (IC) chip. It may also reduce the chip size and allow for increased IC density. Minimum device separation is determined only by the limitations of current lithography techniques. SOI also offers increased circuit speed, due to reductions in parasitic capacitance and chip size.

This invention provides a simple method for forming both partially depleted (PD) and fully depleted (FD) devices on a single SOI semiconductor chip. For simplicity, the invention will be discussed in the environment of a memory chip, but such a discussion represents only an exemplary embodiment and other types of circuits using both partially depleted and fully depleted devices may be formed with a process of the invention on a single semiconductor chip.

By utilizing the process of this invention, memory chips may be obtained that utilize both the device behavior advantages of fully depleted devices and the drive and speed advantages of partially depleted devices. Additionally, by utilizing the process of this invention, a single Silicon-on-Insulator (SOI) substrate may be fabricated, which has the performance advantages of both individual FD SOI and PD SOI substrates. The invention utilizes a process flow whereby FD SOI devices are utilized in one area of the chip and PD SOI devices are utilized in other areas of the chip. The choice of FD or PD is determined by the circuit application in the specific area of the chip.

By using the process of the invention, a SOI device having both fully depleted and partially depleted devices may be fabricated having better SOI surface uniformity in terms of flatness, thickness control, and manufacturability, than is found in the prior art. The SOI surface that may be obtained from this invention is flatter and smoother than those available in the prior art, as well as being free from the impurities, defects, or contaminants that could result from current technologies. An example of such improvements is in the lack of residuals (process contaminants) at the interface of the buried oxide and the silicon substrate of the SOI wafer. The reduction of residuals at this interface makes the structure resulting from the invention's process more uniform and consistent, thereby also making it simpler and much cheaper to manufacture.

In an exemplary embodiment of the invention, which will be further described below, FD devices are used in a memory array of a memory device to allow for improved access device behavior and improved refresh. PD devices are used in the periphery circuit of the memory device to allow for increased drive current and faster circuit operation. This invention may be applied to DRAMs in general, and is particularly pertinent for Embedded-DRAMs because of their large proportion of associated logic circuitry. While the embodiment describes a DRAM flow, this process can also be applied to any memory or other semiconductor chip (e.g., SRAM, Flash, etc.) where the differing modes of SOI operation (FD, PD, and NFD) would be useful in different regions of the circuit.

Figure 4:
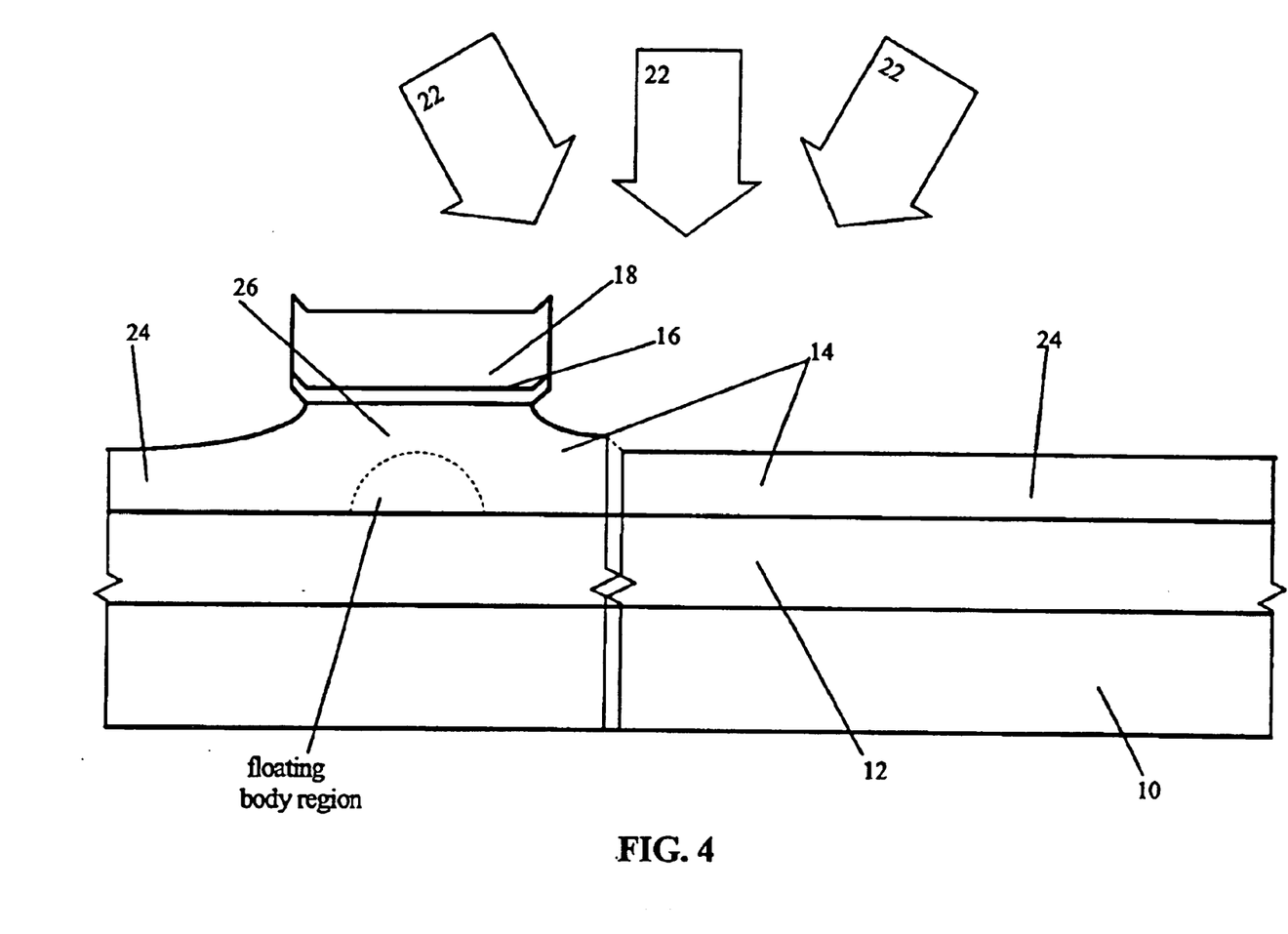
FIG. 4 shows the structure depicted in FIG. 3 at a subsequent stage of processing wherein a portion of the silicon layer is implanted by ionization and depleted regions are formed.
Figure 5:
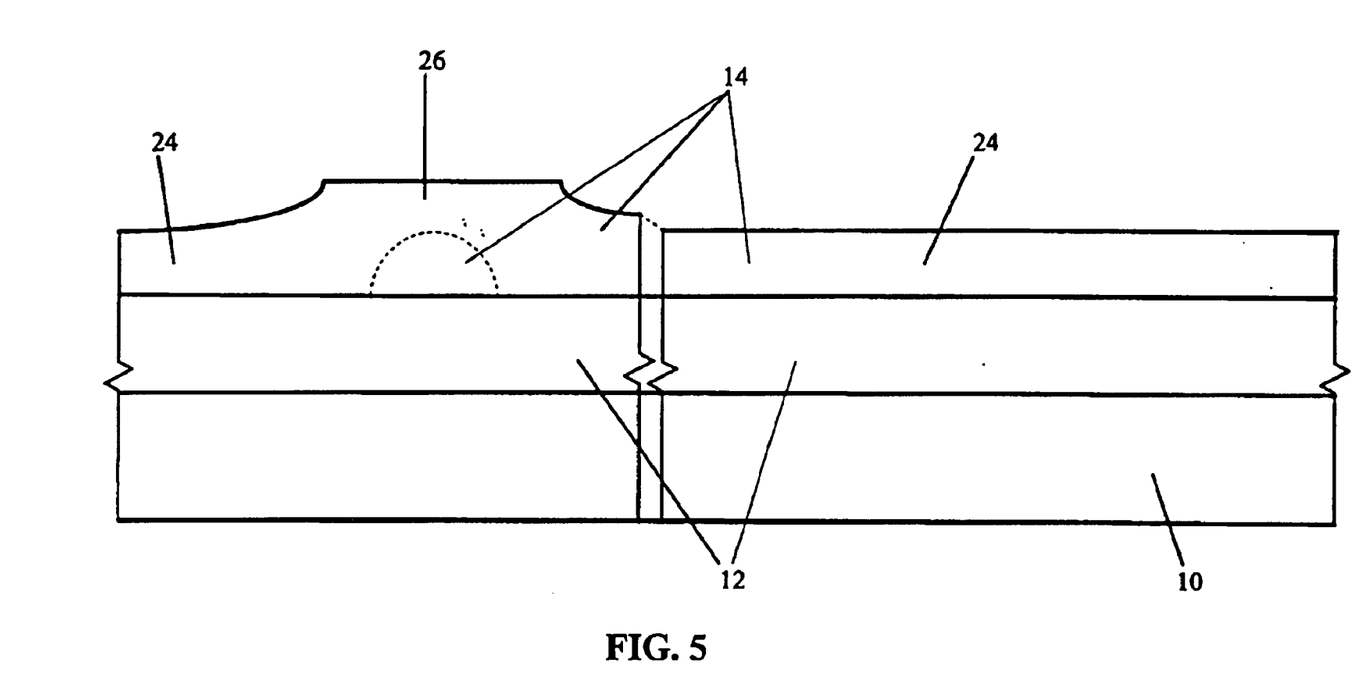
FIG. 5 shows the structure depicted in FIG. 4 at a subsequent stage of processing wherein the pad oxide and nitride mask are removed.
Figure 6:
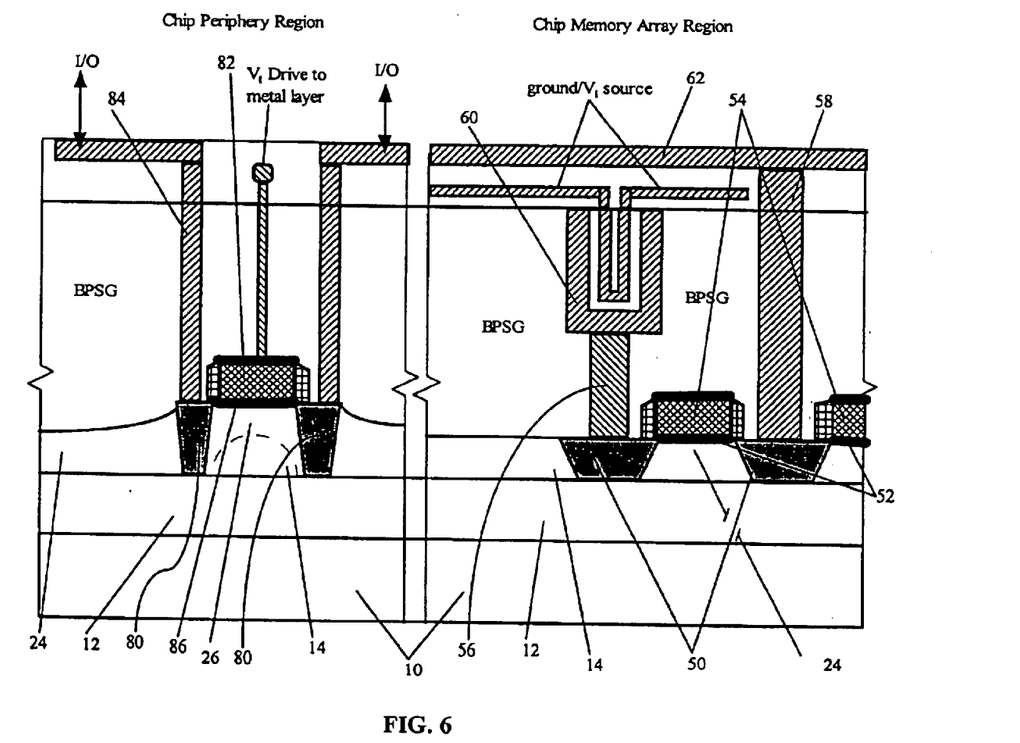
FIG. 6 shows the structure depicted in FIG. 5 wherein integrated circuit devices, e.g., transistors, are formed over the substrate.

Referring to the drawings, where like elements are designated by like reference numerals, FIGS. 1–6 illustrate a method for the fabrication of a memory chip having a SOI substrate 14 with fully depleted regions 24 and partially depleted regions 26, resulting in devices being formed over the appropriate regions so as to obtain the advantages of each region on a single chip (FIG. 6).

Figure 1:
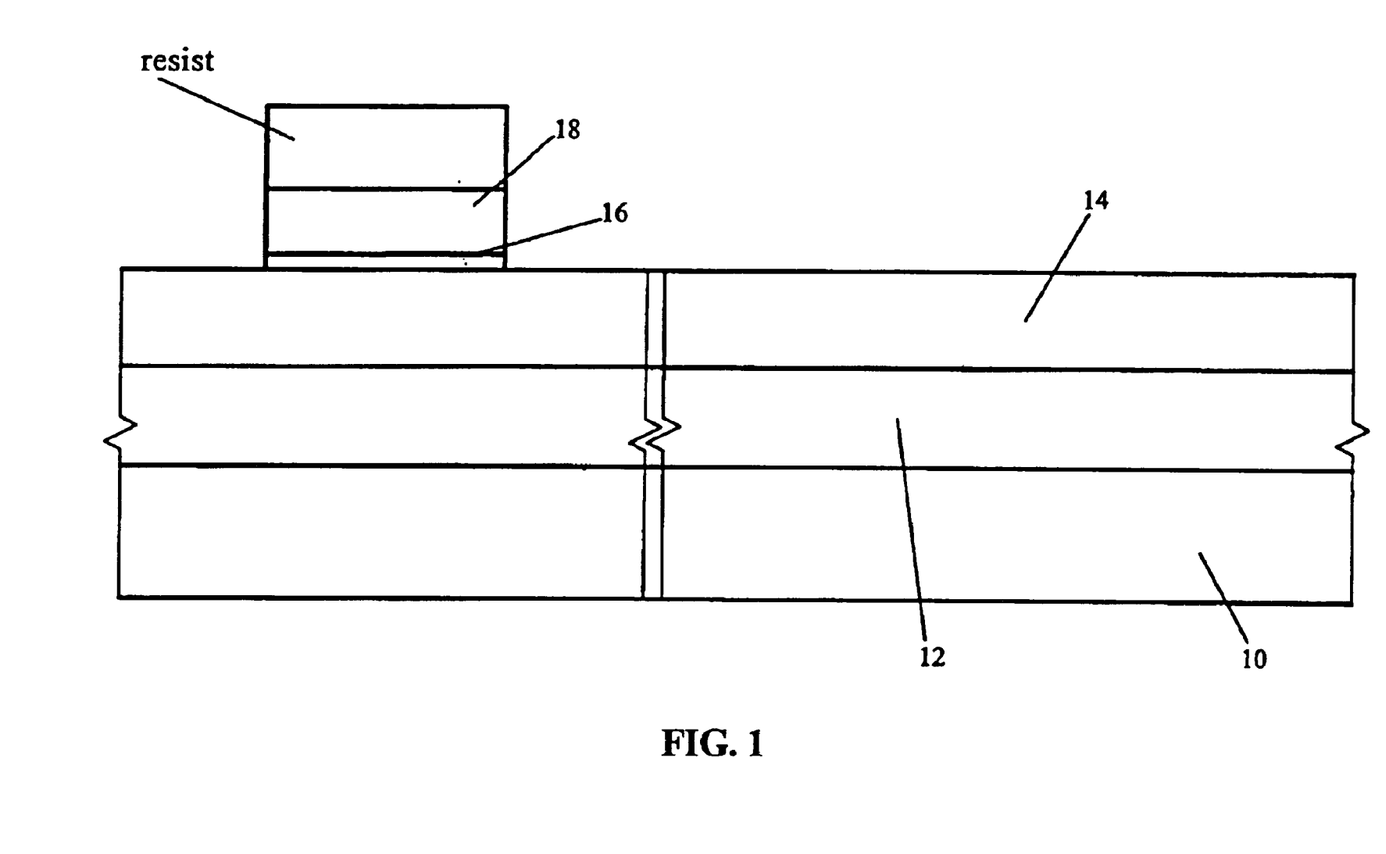
FIG. 1 shows connected portions of a SOI semiconductor substrate used in an exemplary embodiment of the invention, having a BOX layer, an upper silicon layer and a pad oxide and nitride mask.

Referring to FIG. 1, an upper silicon layer is formed over a buried oxide layer (BOX) 12. The BOX 12 is formed over the original silicon substrate 10. The upper silicon layer 14 is initially chosen to have a thickness designed to be partially depleted. A thickness of approximately 200 nm is appropriate for the requirements of current technology, but may be changed as the technology evolves.

A pad oxide 16 is deposited over the entire upper silicon layer 14. This may be accomplished by a dry oxidation/TLC oxidation process to form a layer of oxide across the upper silicon layer 14 surface at 957° C. Oxygen ($O_2$) introduced into an atmospheric furnace reacts with the silicon wafer to produce a layer of silicon dioxide ($SiO_2$). The purpose of the pad oxide layer 16 is to cushion the transition of stresses between the silicon layer and the nitride mask 18 to be deposited next, and to also act as an etch stop. Therefore, a thickness of the pad oxide 16 that will avoid the formation of dislocations in the overlying nitride layer (to be deposited next) or in the underlying silicon layer may be used, for example, about 90 Angstroms.

The nitride mask layer 18 and pad oxide layer 16 are patterned by photolithographic techniques using an array $V_t$ mask, which is open in the array-area and blocked in the periphery-area for various implant levels. The purpose of utilizing the array mask is to define the memory array area over the wafer. It is this area where the nitride mask 18 and the pad oxide 16 must later be removed to expose the underlying silicon layer 14. A resist pattern is normally used to protect the areas desired not to be removed (here the periphery areas). This includes the portions of the nitride mask 18 and pad oxide 16 needed to protect specific regions of the upper silicon layer 14 during the next step of oxidation (see FIG. 2). These areas protected by the nitride mask 18 and the pad oxide 16 will become the partially depleted regions formed later (see FIG. 4).

The nitride mask 18 and pad oxide 16 are next selectively etched down to the upper silicon layer 14, resulting in selected portions of the upper silicon layer 14 being exposed leaving the structure shown in FIG. 1. In this etching step, the nitride layer 18 may first be removed down to the pad oxide 16 by a plasma etch using $Cl_2$ and $NH_3$. The nitride may also be etched using a hot phosphoric acid solution. An over-etch may be used to ensure that all nitride is removed out of the desired areas. The pad oxide 16 is next removed by a HF etch where over-etching will ensure removal of all unwanted pad oxide. Alternatively, a general dry-etch may be used to etch the entire stack of nitride layer 18 and pad oxide 16 to form the structure shown in FIG. 1. All such removal methods are well known. The resist used to pattern the nitride mask 18 and pad oxide 16 is removed next. After etching, the nitride mask 18 and underlying pad oxide 16 remain over portions of the wafer over which periphery devices will later be formed (see FIG. 6).

Figure 2:
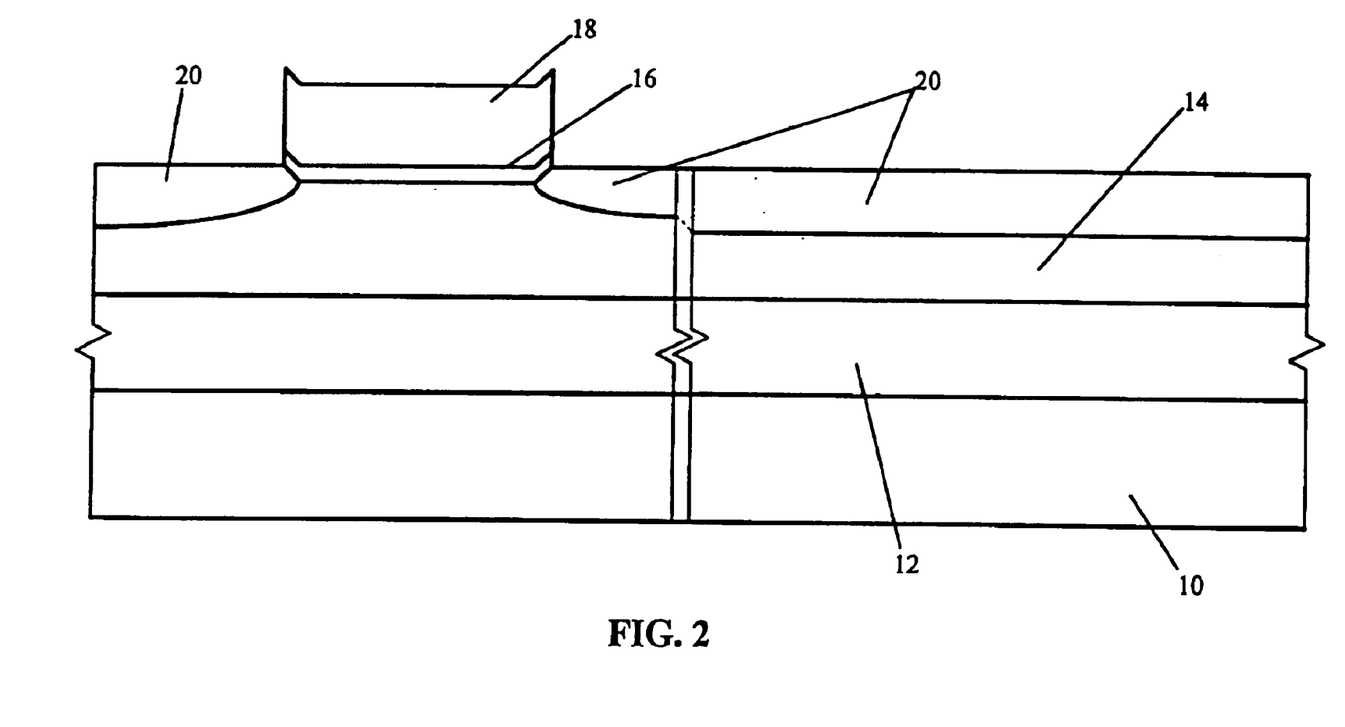
FIG. 2 shows the structure depicted in FIG. 1 at a subsequent stage of processing wherein the upper silicon layer has been oxidized.

Now referring to FIG. 2, the exposed areas of the upper silicon layer 14 are next oxidized using a process similar to LOCOS. This oxidation may be performed in an oxygen or water vapor ambient, at temperatures dependant upon the desired oxidation rate; however, a dry-oxidation process is more controllable. To grow the thick layer of oxide 20, a steam oxidation process may also be used, by which oxygen and hydrogen are pumped into an atmospheric furnace at about 1000° C. for the desired time to produce this oxidized layer 20. No matter what process is utilized, the oxide will grow where there is no nitride mask 18. The silicon oxide layer 20 may be formed of, for example, silicon dioxide, up to a thickness of about 100 nm or greater. However, as well known in the art, the thickness of the silicon oxide layer 20 may vary greatly, depending on the processing requirements and desired device characteristics, and most importantly depending on the ultimate desired thickness of the upper silicon layer 14 desired in the array area. The invention is not limited to silicon dioxide as the silicon oxide layer, other oxide types as known in the art may be utilized as well. Any known method of forming a SOI substrate may be used for this invention and any derivative oxide thereof is acceptable.

Figure 3:
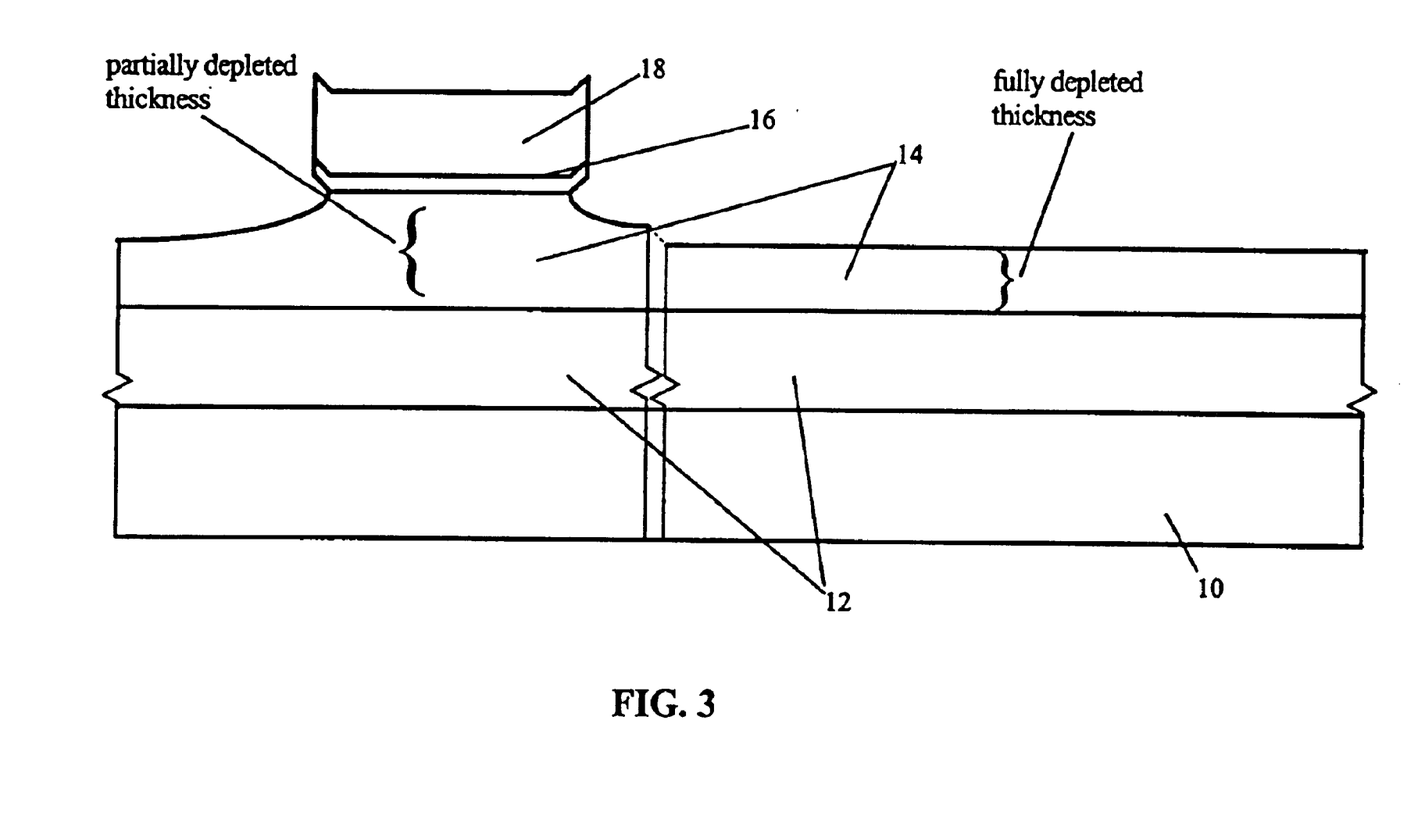
FIG. 3 shows the structure depicted in FIG. 2 at a subsequent stage of processing wherein an oxidized portion of the upper silicon has been removed.

As shown in FIG. 3, the grown oxide 20 is striped using an oxide etch. This oxide layer 20 may be etched using a solution of ammonium fluoride and hydrofluoric acid, preferably by an HF dip. This step thins the array region of the upper silicon layer 14 to a fully depleted thickness, preferably 100 nm or less. It is this thinning of the upper silicon layer that differentiates the fully depleted regions from the partially depleted regions. It is at this point in the processing that both fully and partially depleted thickness regions are formed on the substrate.

At this point in the processing, as shown in FIG. 4, Array threshold voltage ion ($V_t$) implants 22 are produced using Boron ions. This sets the threshold voltage of the access devices. This is a self-aligning process as the same mask used in the prior steps to thin the upper silicon layer 14 are now used to set the threshold voltage. The regions where the upper silicon layer 14 was oxidized and subsequently thinned by removal of the oxidized silicon 20, are now implanted with the Boron ions for form fully depleted regions 24 down to the BOX 12 layer. The regions under the nitride mask 18 and pad oxide 16 are thicker and are now partially depleted regions 26. The fully depleted regions will have a high-threshold voltage associated with any subsequently formed gate and the partially depleted regions will have a low-threshold voltage associated with any subsequently formed gate (see FIG. 6). As show in FIG. 4, both fully depleted and partially depleted regions are on a single chip, selected by the location of the nitride mask 18. In the fully depleted regions 24, the transistor depletion region penetrates through the entire remaining upper silicon layer 14 to the BOX layer 12, but in the partially depleted regions 26, the transistor depletion regions do not fully penetrate because of the greater thickness of the upper silicon layer 14 and the remaining nitride mask 18, leaving an undoped float region.

Note that in standard DRAM processing, an Array $V_t$ implant is typically performed later in the processing. Because of the implantation at this early stage, no additional later implant or associated photo masking step is required. Also note that for fully depleted SOI regions, the $V_t$ implant is equivalent to well implants. Because the ultimate SOI devices will be isolated from one another, there will be no common "well" that is shared by all. Thus, for SOI, a well implant is equivalent to a $V_t$ implant.

Referring to FIG. 5, the next step in processing is to strip the nitride mask 18 and the pad oxide 16. This step may be performed by using hot phosphoric acid with water to strip the nitride mask 18 and using a HF dip to etch away the pad oxide 16. This HF dip may also remove any remaining oxide left from the preceding step.

As shown in FIG. 6, after the remaining SOI upper silicon layer 14 is exposed, conventional DRAM processing may continue over this substrate layer. Such processing includes the forming of memory cells over the fully depleted regions for improved access device behavior and improved refresh, among other advantages. Thus, over the fully depleted regions of the array, the processing includes the forming of source/drain areas 50, forming gate oxides 52, forming wordline gates 54, forming capacitor plugs 56 and bit line plugs 58, forming capacitors 60, forming bit lines 62, and other conventional processing steps as know in the art, including cell metallization, to form a completed memory cell.

Also shown in FIG. 6, conventional IC processing continues over the partially depleted regions 26 as well. Over these partially depleted regions 26 the periphery devices are formed to take advantage of the increased drive current and faster circuit operation properties of partially depleted devices, among other advantages. Thus, over these partially depleted regions, devices such as sense amplifiers, control logic circuits, and address registers, for example, or any other devices which would benefit from increased drive current or faster operation, may be formed as known in the art. Such devices incorporate peripheral transistors having peripheral source and drain regions 80, peripheral transistor gates 82 over peripheral gate oxides 86, peripheral metal contacts 84 to the source/drain regions 80 for current input and output, and other circuit elements known in the art.

Figure 7:
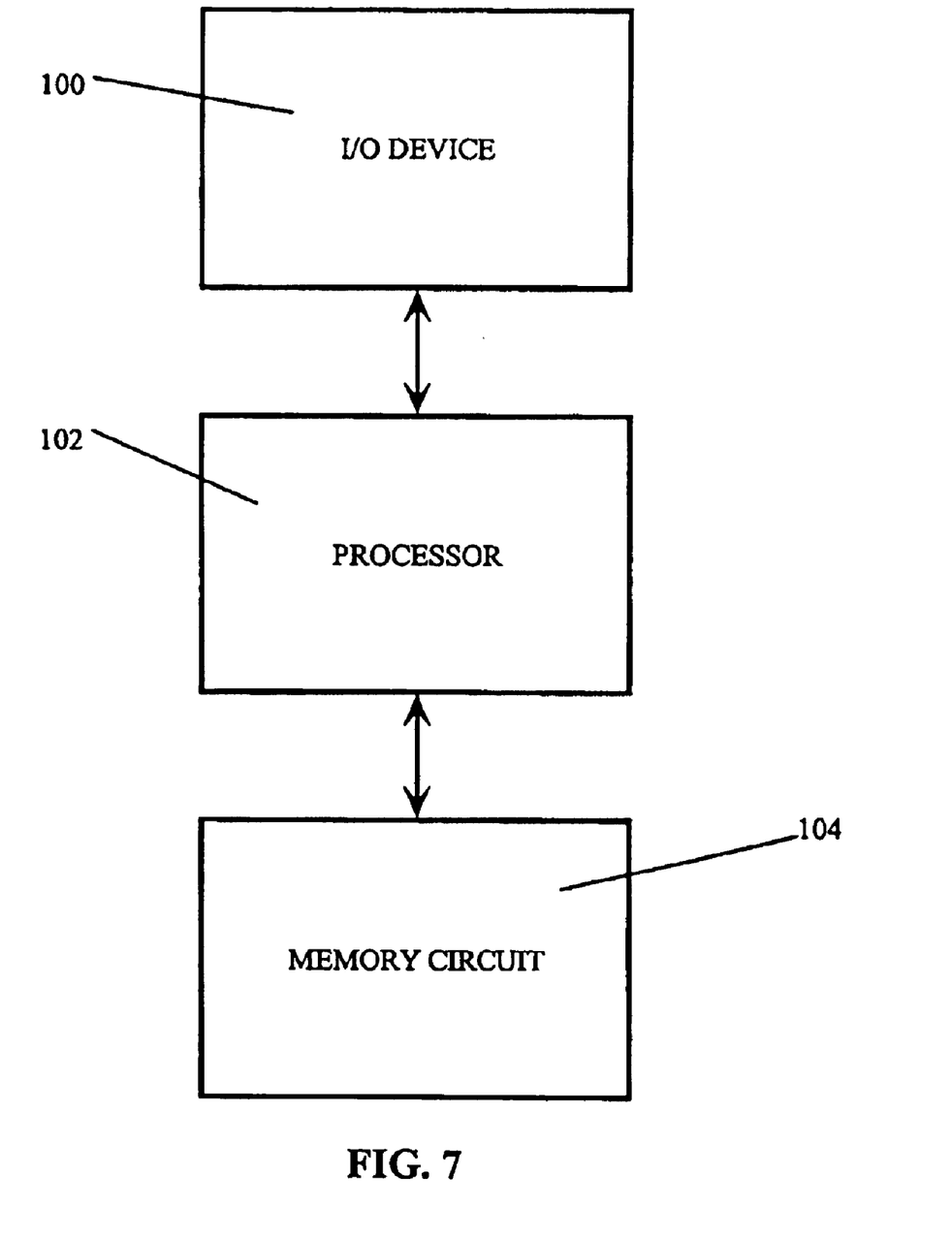
FIG. 7 depicts a processor system including a semiconductor device formed in accordance with the present invention.

FIG. 7 illustrates a processor system (e.g., a computer system), with which a memory having a memory cell area and a periphery logic area as described above may be used. The processor system comprises a central processing unit (CPU) 102, a memory circuit 104, and an input/output device (I/O) 100. The memory circuit 104 contains a DRAM, or other memory device, including semiconductor devices constructed in accordance with the present invention. Also, the CPU 102 may itself be an integrated processor, which utilizes semiconductor devices constructed in accordance with the present invention, and both the CPU 102 and the memory circuit 104 may be integrated on a single chip, so as to fully utilize the advantages of the invention.

In an alternative embodiment, the invention may also be used to form near fully depleted (NFD) devices, another type of partially depleted device. A near fully depleted device is one that operates in either the fully depleted mode or in the partially depleted mode, depending upon the bias conditions of the transistor associated with the depletion region. Though the structure of the SOI substrate in a NFD region is of a partially depleted region 26, the device operates as a borderline case between a FD and a PD device.

Again, the key to forming a near fully depleted region on the SOI substrate depends upon the thickness of the upper silicon layer 14 when implanted with ions 22, which is between that of a FD 24 and a PD 26 region. Here, the initial thickness (refer to FIG. 1) of the upper silicon layer 14 must be somewhat thinner than if forming the partially depleted regions 26 as described above. This is because the difference between the resulting thickness of the fully depleted 24 and near fully depleted regions is smaller than that between the FD 24 and PD 26 regions described above.

Though the thicknesses of the resulting structures may be different, the processing to achieve the NFD regions and the FD regions 24 on the same SOI substrate is the same as described above and illustrated in FIGS. 1 to 5, but must compensate for the Though the thicknesses of the resulting structures may be different, the processing to achieve the NFD regions and the FD regions 24 on the same SOI substrate is the same as described above and illustrated in FIGS. 1 to 5, but must compensate for the desired thinner upper silicon layer 14 as described. After the formation of the NFD and FD 24 regions in the upper silicon layer 14, the processing continues as described above and shown in FIGS. 6 and 7, where periphery devices will be formed over the NFD regions and memory devices will be formed over the fully depleted regions 24.

The above description and accompanying drawings are only illustrative of exemplary embodiments, which can achieve the features and advantages of the present invention. It is not intended that the invention be limited to the embodiments shown and described in detail herein. The invention can be modified to incorporate any number of variations, alterations, substitutions or equivalent arrangements not heretofore described, but which are commensurate with the spirit and scope of the invention. The invention is only limited by the scope of the following claims.

What is claimed as new and desired to be protected by Letters Patent of the United States is:

1. A semiconductor device, comprising:
   a silicon-on-insulator substrate having an upper silicon layer;
   at least one near fully depleted periphery transistor over a first region of said upper silicon layer having a first thickness; and
   at least one fully depleted transistor over a second region of said upper silicon layer having a thickness less than said first thickness.

2. The semiconductor device of claim 1, wherein said second region has a thickness not greater than about 100 nm.

3. The semiconductor device of claim 1, wherein said first region has a thickness between about 100 nm and about 200 nm.

4. The semiconductor device of claim 1, wherein said at least one fully depleted transistor and said at least one near fully depleted periphery transistor are part of a memory device circuit.

5. A semiconductor device, comprising:
   a silicon-on-insulator substrate having an upper silicon layer;
   at least one fully depleted device formed over a portion of said upper silicon layer that has a thickness not greater than 100 nm and at least one near fully depleted periphery device formed over a portion of said upper silicon layer that has a thickness between about 100 nm to about 200 nm.

6. The semiconductor device of claim 5, wherein said at least one fully depleted device and said at least one near fully depleted periphery device are part of a memory device circuit.

7. A memory device, comprising:
   a silicon-on-insulator substrate having an upper silicon layer;
   at least one partially depleted transistor and at least one near fully depleted periphery transistor over a first region of said upper silicon layer having a first thickness; and
   at least one fully depleted transistor over a second region of said upper silicon layer having a thickness less than said first thickness.

8. The memory device of claim 7, wherein said first region has a thickness between about 100 nm and about 200 nm.

9. The memory device of claim 7, wherein said second region has a thickness not greater than about 100 nm.

10. The memory device of claim 7, wherein said at least one partially depleted transistor, said at least one near fully depleted periphery transistor, and said at least one fully depleted transistor are part of a memory device circuit.

11. The memory device of claim 7, further comprising a SRAM.

12. The memory device of claim 7, further comprising a DRAM.

13. A processor system, comprising:
   a processor; and
   a memory circuit coupled to said processor, at least one of said processor and memory circuit comprising a silicon-on-insulator substrate having an upper silicon layer with at least one near fully depleted periphery transistor over a first region of said upper silicon layer having a first thickness, and at least one fully depleted transistor over a second region of said upper silicon layer having a thickness less than said first thickness.

14. The processor system of claim 13, wherein said at least one fully depleted transistor, said at least one near fully depleted periphery transistor, said at least one partially depleted periphery transistor are part of a memory device circuit.

15. The processor system of claim 13, wherein said second region of said upper silicon layer has a thickness not greater than 100 nm.

16. The processor system of claim 13, wherein said first thickness is between about 100 nm and about 200 nm.

17. The processor system of claim 13, wherein said silicon-on-insulator substrate having said upper silicon layer with said first and second regions is part of a memory device.

18. The processor system of claim 13, wherein said silicon-on-insulator substrate having said upper silicon layer with said first and second regions is part of said processor.

19. The processor system of claim 13, wherein said processor and said memory circuit are integrated on a single chip.

* * * * *

UNITED STATES PATENT AND TRADEMARK OFFICE
CERTIFICATE OF CORRECTION

PATENT NO. : 6,818,496 B2
DATED : November 16, 2004
INVENTOR(S) : Charles H. Dennison et al.

It is certified that error appears in the above-identified patent and that said Letters Patent is hereby corrected as shown below:

Column 5,
Line 50, "arc" should read -- are --
Line 51, "form" should read -- forming --
Line 58, "show" should read -- shown --

Column 6,
Line 26, "know" should read -- known --

Column 7,
Lines 11-15, delete

Signed and Sealed this

Thirty-first Day of May, 2005

JON W. DUDAS
*Director of the United States Patent and Trademark Office*